United States Patent
Hegde et al.

(10) Patent No.: US 6,383,873 B1
(45) Date of Patent: May 7, 2002

(54) PROCESS FOR FORMING A STRUCTURE

(75) Inventors: Rama I. Hegde; Philip J. Tobin; Amit Nangia, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/575,204

(22) Filed: May 18, 2000

(51) Int. Cl.$^7$ .............................................. H01L 21/336
(52) U.S. Cl. ........................ 438/287; 438/761; 438/762
(58) Field of Search .................................. 438/278, 761, 438/762, 763, 765, 769, 775, 785, 786

(56) References Cited

U.S. PATENT DOCUMENTS 6,020,243 A * 2/2000 Wallace et al. ............. 438/287

OTHER PUBLICATIONS

Wilk et al., "Hafnium and zirconium silicates for advanced gate dielectrics," American Institute of Physics, pp. 484–492 (2000).
Copel et al., "Structure and stability of ultrathin zirconium oxide layers on Si(001)," American Institute of Physics, pp. 436–438 (2000).
Wilk et al., "Stable zirconium silicate gate dielectrics deposited directly on silicon," American Institute of Physics, pp. 112–114 (2000).
Campbell et al., "Titanium dioxide ($TiO_2$)–based gate insulators," IBM J. Res. Develop. vol. 33, pp. 383–392 (1999).
Jeon et al., "Effect of Barrier Layer on the Electrical and Reliability Characteristics of High–k Gate Dielectric films," IEEE, pp. 797–800 (1998).
Shappir et al., Investigation of MOS Capacitors with Thin $ZrO_2$ Layers and Various Gate Materials for Advanced DRAM Applications, IEEE, pp. 442–449 (1986).

* cited by examiner

*Primary Examiner*—David Nelms
*Assistant Examiner*—Dung A. Le

(57) ABSTRACT

A finished structure (100) includes a semiconductive region (102), a first oxide layer (106), a second oxide layer (108), and a conductive layer (110). The first oxide layer (106) lies between the semiconductive region (102) and the second oxide layer (108); and the second oxide layer (108) lies between the first oxide layer (106) and the conductive layer (110). The first oxide layer (106) includes at least a portion that is amorphous or includes a first element, a second element, and a third element. In the latter, the first element is a metallic element, and each of the first, second, and third elements are different from each other. A process for forming a structure (100) includes forming a first layer (106) near a semiconductive region (102), forming a second layer (108) after forming the first layer (106), and forming a third layer (110) after forming the second layer (108). The first oxide layer (106) includes a metallic element and oxygen. The third layer (110) is a non-insulating layer.

12 Claims, 1 Drawing Sheet

PROCESS FOR FORMING A STRUCTURE

RELATED APPLICATIONS

The present invention relates to another co-pending application entitled "Selective Removal of a Metal Oxide Dielectric" which was filed on May 18, 2000 and has a serial number of 09/574,732 and is assigned to the same assignee as the present application.

RELATED ART

In the field of semiconductor fabrication, the use of high-k dielectric materials is becoming increasingly common as the desire to increase the device speeds places practical limitations on the thickness of conventional (low-k) dielectric materials such as silicon oxide. Typical high-k dielectric materials for use include metal oxide or metal silicate materials, such as zirconium oxide ($ZrO_2$), zirconium silicate ($Zr_xSi_yO_z$), hafnium oxide ($HfO_2$), and hafnium silicate ($Hf_xSi_yO_z$). Unfortunately, it is difficult to incorporate metal oxide dielectrics into processes that use polysilicon gate electrodes. During the conventional deposition of polysilicon on a metal oxide dielectric film, chemical reactions between the source gas used for polysilicon deposition and the metal oxide dielectric can reduce portions of the dielectric thereby adversely affecting the electrical characteristics of the film and degrading device performance or reliability. It would, therefore, be desirable to implement a fabrication process utilizing a metal oxide gate dielectric that is compatible with the subsequent use of conventional polysilicon gates.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A finished structure includes a semiconductive region, a first oxide layer, a second oxide layer, and a conductive layer. The first oxide layer lies between the semiconductive region and the second oxide layer; and the second oxide layer lies between the first oxide layer and the conductive layer. The first oxide layer includes at least a portion that is amorphous or includes a first element, a second element, and a third element. In the latter, the first element is a metallic element, and each of the first, second, and third elements are different from each other. A process for forming a structure includes forming a first layer near a semiconductive region, forming a second layer after forming the first layer, and forming a third layer after forming the second layer. The first oxide layer includes a metallic element and oxygen. The third layer is a non-insulating layer. The present invention is defined by the appended claims and is better understood after reading details regarding the embodiments described below.

Figure 1:
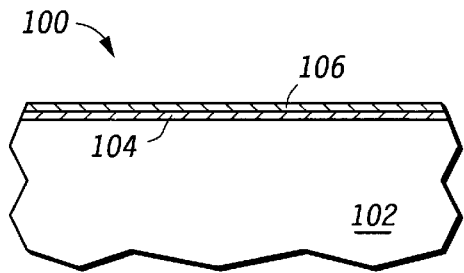
FIG. 1 includes a partial cross-sectional view of a partially completed semiconductor device including a first oxide layer formed over a semiconductor substrate.

Turning now to the drawings, FIG. 1 includes a partial crosssectional view of a semiconductor device 100. Semiconductor device 100 includes a first oxide layer 106 formed near (but not necessarily in contact with) a semiconductive region 102. In the depicted embodiment, first oxide layer 106 lies above semiconductive region 102 and an interfacial oxide layer 104. In one embodiment, semiconductive region 102 includes the substrate (bulk) of a single crystal silicon wafer well known in the field of semiconductor fabrication. In other embodiments, the semiconductive region 102 may be part of a monocrystalline semiconductor wafer, a semiconductor-on-insulator wafer, or any other substrate suitable for forming semiconductor devices.

First oxide layer 106 includes a first element and a second element that is different from the first element. The first element of first oxide layer 106 may be a metallic element (metal) and the second element may be oxygen. Suitable metals for use as the first element of first oxide layer 106 include group IIIA, IVA, of VA elements as designated by the International Union of Pure and Applied Chemistry. These elements include zirconium (Zr), hafnium (Hf), lanthanum (La), niobium (Nb), tantalum (Ta), titanium (Ti), and strontium (Sr).

In one embodiment, at least a portion of first oxide layer 106 has an amorphous structure and, more typically, first oxide layer 106 is substantially or entirely amorphous. In this embodiment, the amorphous structure of first oxide layer 106 is desirable for its uniform electrical characteristics. First oxide layer 106 may further include a third element that is different from the first and second elements. In an embodiment, in which the first element of first oxide layer 106 is a metal and the second element is oxygen, and the third element may include silicon, aluminum, tantalum, tin, or the like. Thus, suitable embodiments of first oxide layer 106 include metal oxides, where, for purposes of this disclosure, a metal oxide is a compound including a metallic element, oxygen, and possibly an additional element. Still other embodiments of first oxide layer 106 may include a fourth element such as nitrogen. Thus, compounds including TaAlON or TiAlON may be suitable for use as first oxide layer 106.

First oxide layer 106 is typically a high-k material having a dielectric constant greater than the dielectric constant of thermally formed silicon dioxide. In an embodiment in which first oxide layer 106 includes a metal element and oxygen (such as $ZrO_2$), the dielectric constant of first oxide layer 106 may be as high as 25. If first oxide layer 106 includes a metal element, oxygen, and a third element such as silicon, (e.g., $Zr_xSi_yO_z$ where $x \leq y$) the dielectric constant of first oxide layer 106 may be in the range of approximately 10 to 15. In one embodiment, the thickness of first oxide layer 106 is in the range of approximately 2–8 nanometers and is more typically approximately 5 nanometers in thickness.

In one embodiment, semiconductive region 102 is immersed in or otherwise exposed to an HF treatment prior to the formation of first oxide 106. First oxide layer 106 may be formed with a chemical vapor deposition process at a temperature of less than approximately 550° C. In one such embodiment, the source gasses used to form first oxide layer 106 may be adjusted during the deposition process to produce a first oxide in which a first portion of the film has a relatively lower atomic percentage of metal than remaining portions of the film. In an embodiment in which first oxide layer 106 is a CVD $Zr_xSi_yO_z$ compound, the flow rate of the zirconium source may be reduced during latter stages of the deposition cycle to reduce the amount of zirconium formed at the upper surface of first oxide layer 106. In another embodiment, first oxide layer 106 may be sputter deposited.

The formation of first oxide layer 106 may result in the formation of the interfacial oxide layer 104 between first oxide layer 106 and semiconductive region 102. In one embodiment, this interfacial oxide layer 104 may comprise a thermally formed silicon oxide film of less than approximately 1 nanometer in thickness.

Figure 2:
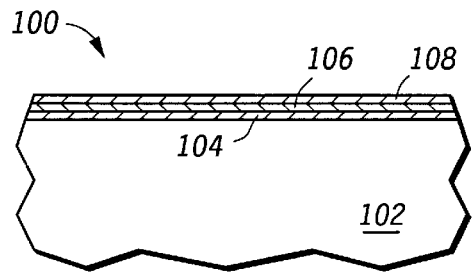
FIG. 2 illustrates a processing step subsequent to FIG. 1 in which a second oxide layer is formed over the first oxide layer.

Generally, the second oxide layer 108 typically includes silicon and oxygen and may include additional elements such as nitrogen or carbon. Turning now to FIG. 2, a second oxide layer 108 is formed over first oxide layer 106. In one embodiment, second oxide layer 108 comprises a silicon-oxygen compound, such as silicon dioxide, having no more than approximately one atomic percent metallic element content and, more typically, having a metallic element content of less than approximately 0.09 atomic percent. Second oxide layer 108 is formed, in one embodiment, by exposing first oxide layer 106 to an oxidizing ambient such as by annealing substrate 102 in a controlled ambient containing oxygen ($O_2$), nitrous oxide ($N_2O$), ozone ($O_3$), nitric oxide (NO) or the like and maintained at a temperature in the range of approximately 400–800° C. In this embodiment, it is theorized that silicon from the semiconductive region 102 migrates to the upper surface of the wafer and reacts with the ambient to form the silicon oxide film. The anneal may be performed sequentially with the deposition of first oxide layer 106 using one or more chambers of a CVD tool such that substrate 102 is not subjected to a room atmosphere between the deposition of first oxide layer 106 and the thermal formation of second oxide layer 108.

In one embodiment, second oxide layer 108 may be formed by depositing a silicon oxide layer that is substantially free of metallic elements. This deposition process might include, for example, liquid phase deposition of a thin (i.e., less than approximately 0.5 nanometers) $SiO_x$ film using an aqueous silicon-oxygen bearing solution from which solid phase $SiO_x$ is formed at room temperature at a relatively low deposition rate (i.e., approximately 0.5 nanometers per minute). In another embodiment, second oxide layer 108 may be formed with a low temperature oxide (LTO) deposition process at a temperature in the range of approximately 100–400° C. The deposition of second oxide layer 108 may be facilitated with an energy assisted deposition process, such as a plasma enhanced CVD.

In one embodiment, the thickness of second oxide layer 108 is maintained to be less than approximately 0.9 nanometers. The formation of second oxide layer 108 over first oxide layer 106 substantially prevents oxide bonds present in first oxide layer 106 from reacting with hydrogen or other chemicals during a subsequent deposition process thereby minimizing the chemical reduction of first oxide layer 106 during subsequent processing. It is desirable to minimize the thickness of second oxide layer 108 to maintain the high-k characteristics of the composite dielectric film. Thus, the ideal thickness of second oxide layer 108 is sufficient to terminate oxygen in first oxide layer 106 with silicon without substantially increasing the overall thickness of the dielectric. It is theorized that an ideal second oxide layer 108 may comprise one or two monolayers of silicon oxide.

Figure 3:
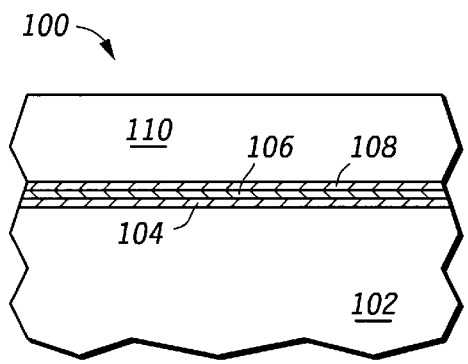
FIG. 3 illustrates a processing step subsequent to FIG. 2 in which a conductive, resistive, or semiconductive layer is formed over the second oxide layer.

Turning now to FIG. 3, a third layer 110 is formed over second oxide layer 108. In one embodiment, third layer 110 is a silicon layer or other suitable conductive, resistive, or semiconductive layer. In an embodiment in which third layer 110 includes silicon, third layer 110 may be formed by the thermal decomposition of a precursor, such as silane, containing hydrogen in a CVD reactor chamber at a temperature in the range of approximately 550 to 800° C. as is well known in semiconductor fabrication technology. In one embodiment, the crystalline structure of silicon in third layer 110 is amorphous while, in another embodiment, the silicon in third layer 110 may be crystalline. In addition to the methods described above, the silicon layer may be deposited by physical vapor deposition.

The presence of second oxide layer 108 over the first oxide layer 106 during the formation of third layer 110 beneficially reduces or eliminates the reduction of metal oxide in first oxide layer 106. In the absence of second oxide layer 108, hydrogen present in the ambient during the conventional deposition of third layer 110 will react with exposed metal oxide bonds in first oxide layer 106 and alter the electrical or capacitive characteristics of first oxide layer 106.

In one embodiment, third layer 110 is a metal or other conductive material such as tungsten, tantalum, aluminum, or a suitable alloy thereof. In this embodiment, the deposition of third layer 110 may require the use of a halogen-bearing or carbonyl-bearing precursor. It is theorized that, in this embodiment, the presence of second oxide layer 108 during the formation of third layer 110 minimizes the reduction of first oxide layer 106 in the same manner that second oxide layer 108 prevents reduction of first oxide layer 106 in a hydrogen bearing ambient.

Figure 4:
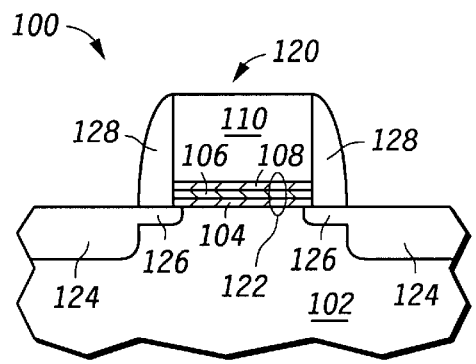
FIG. 4 illustrates a processing step subsequent to FIG. 3 in which a transistor is formed.

Turning now to FIG. 4, a transistor 120 of semiconductor device 100 is depicted. In the depicted embodiment of transistor 120, first and second oxides layers 106 and 108 form part of a gate dielectric 122 of transistor 120 while third layer 110 forms part of a gate electrode of transistor 120. Transistor 120 further includes doped regions 124 that provide the current carrying electrodes of transistor 120. In an embodiment of transistor 120 in which third layer 110 comprises polysilicon, third layer 110 may be doped with a suitable dopant such as phosphorus, arsenic, boron, or the like such that third film 110 comprises a doped polycrystalline layer.

Transistor 120 is formed by patterning a gate masking layer over third layer 110 and performing a gate etch process to remove portions of third layer 110 defined by the gate mask. After the gate mask and etch processes, a first implant may be performed to introduce extension portions 126 of doped region 124 into semiconductor device substrate 102. Spacer structures 128, which may include one or more dielectric materials such as oxide and silicon nitride, are then formed on sidewalls of the gate. After forming spacer structures 128, doped regions 124 are completed with source/drain implant as is familiar to those knowledgeable in semiconductor device fabrication.

Figure 5:
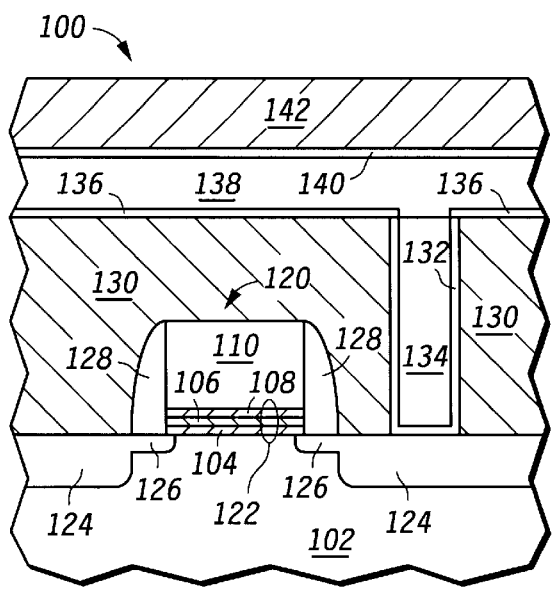
FIG. 5 illustrates a processing step subsequent to FIG. 4 depicting a substantially completed semiconductor device.

Turning now to FIG. 5, the semiconductor device 100 is completed by depositing a first interlevel dielectric (ILD) layer 130 over transistor 120, etching appropriate vias into first ILD 130, filling the first via with a conductive material, forming an interconnect layer, and passivating the entire wafer. In one embodiment, vias in first ILD 130 are filled by first forming a barrier layer 132 on sidewalls of the vias and thereafter filling the vias with a conductive material (plug) 134 typically comprises tungsten. In one embodiment, barrier layer 132 comprises titanium or titanium nitride.

An interconnect layer is formed by first depositing an adhesion layer 136 and thereafter depositing a conductive interconnect 138. In one embodiment, adhesion layer 136 includes tantalum or tantalum nitride and conductive interconnect 138 includes copper. In another embodiment, interconnect 138 includes aluminum and adhesion layer 136 includes titanium or titanium nitride. After depositing and patterning interconnect 138 with an appropriate interconnect mask and etch process, the depicted embodiment of semiconductor device 100 includes a plasma enhanced nitride (PEN) layer 140 formed over interconnect 138. The PEN layer 140 provides a suitable cap for the copper embodiments of interconnect 138. After the formation of PEN layer 140, semiconductor device 100 is passivated by forming passivation layer 142 over PEN layer 140. Passivation layer 142 may include oxynitride, silicon oxynitride, or suitable combinations thereof.

Other electrical connects are made to the semiconductor device 100 but are not shown in the figures. Other insulating layers and interconnects levels may be formed as necessary. Skilled artisans know how to design and form such semiconductor devices.

In one alternate embodiments, the third layer 110 can include a refractory metal nitride (e.g., titanium nitride, tantalum nitride, or the like) or appropriate metal oxide (e.g., ruthenium dioxide, iridium dioxide, or the like) so that the third layer 110 is resistive. In this manner, a relatively simple structure can be formed to place a capacitor or transistor in series with a resistor. In still another embodiment, the orientation of the transistor may be reversed. Referring to FIG. 3 for this embodiment, region 102 can include a conductive portion, and the third layer 110 can be semiconductive and include the channel region of a thin-film transistor. Formation of source and drain regions within the third layer 110 are known by skilled artisans.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a structure comprising:

forming a first layer near a semiconductive region, wherein the first layer includes a metallic element and oxygen;

forming a second layer after forming the first layer and overlying the first layer, wherein the second layer is formed by an act selected from a group consisting of: exposing the first layer to an oxidizing ambient; and depositing a silicon oxide layer that is substantially free of metallic elements; and forming a third layer after forming the second layer and overlying the second layer, wherein the third layer is selected from a group consisting of a conductive layer, a resistive layer, and a semiconductive layer.

2. The process of claim 1, wherein a fourth layer is formed between the first layer and the semiconductive region while forming the first layer.

3. The process of claim 1, wherein the third layer is formed by chemical vapor deposition.

4. The process of claim 3, wherein a precursor is used during forming the third layer, wherein the precursor includes hydrogen.

5. The process of claim 3, wherein a precursor is used during forming the third layer, wherein the precursor includes at least one halogen atom.

6. The process of claim 3, wherein a precursor is used during forming the third layer, and wherein the precursor includes at least one carbonyl group.

7. The process of claim 1, wherein forming the third layer is performed at a temperature of at least approximately 500° C.

8. The process of claim 1, wherein forming the third layer is performed by chemical vapor deposition at a temperature of at least approximately 550° C. using at least silane.

9. The process of claim 1, wherein forming the second layer is performed by exposing the first layer to an oxidizing ambient at a temperature in a range of approximately 100 to 400° C.

10. The process of claim 9, wherein the oxidizing ambient includes a species selected from a group consisting of oxygen, ozone, nitrous oxide, and nitric oxide.

11. The process of claim 1, wherein forming the second layer is performed by depositing a silicon oxide layer having a thickness no greater than approximately 0.9 nanometers.

12. The process of claim 1, wherein:

the structure is part of a semiconductor device;

the first and second layers are part of a gate dielectric of a transistor; and the third layer is part of a gate electrode of the transistor.

* * * * *